United States Patent
Kwon (10) Patent No.: US 8,558,379 B2
(45) Date of Patent: Oct. 15, 2013

(54) FLIP CHIP INTERCONNECTION WITH DOUBLE POST

(75) Inventor: Jinsu Kwon, Campbell, CA (US)

(73) Assignee: Tessera, Inc., San Jose, CA (US)

( * ) Notice: Subject to any disclaimer, the term of this patent is extended or adjusted under 35 U.S.C. 154(b) by 204 days.

(21) Appl. No.: 12/286,102

(22) Filed: Sep. 26, 2008

(65) Prior Publication Data

US 2009/0146303 A1 Jun. 11, 2009

Related U.S. Application Data

(60) Provisional application No. 60/995,849, filed on Sep. 28, 2007.

(51) Int. Cl.
*H01L 23/52* (2006.01)
*H01L 23/48* (2006.01)
*H01L 29/40* (2006.01)

(52) U.S. Cl.
USPC ............... 257/737; 257/E23.021; 257/738; 257/778; 257/779; 438/108; 438/613

(58) Field of Classification Search
USPC .......... 257/E21.499, E23.023, 778, 741, 737, 257/777, 750, 787, 676, E23.021, 738, 786, 257/780, 781, 779; 438/108, 612–614, 666
See application file for complete search history.

(56) References Cited

U.S. PATENT DOCUMENTS

| | | | |
|---|---|---|---|
| 5,587,342 A * | 12/1996 | Lin et al. ..................... | 438/125 |
| 5,786,271 A | 7/1998 | Ohida et al. | |
| 5,985,692 A | 11/1999 | Poenisch et al. | |
| 6,216,941 B1 | 4/2001 | Yokoyama et al. | |
| 6,229,220 B1 * | 5/2001 | Saitoh et al. .................. | 257/780 |
| 6,235,996 B1 | 5/2001 | Farooq et al. | |
| 6,335,571 B1 * | 1/2002 | Capote et al. ................. | 257/787 |
| 6,578,754 B1 | 6/2003 | Tung | |
| 6,648,213 B1 * | 11/2003 | Patterson et al. ............. | 228/223 |
| 6,734,539 B2 | 5/2004 | Degani et al. | |
| 6,734,556 B2 * | 5/2004 | Shibata ......................... | 257/737 |
| 6,815,252 B2 * | 11/2004 | Pendse ......................... | 438/107 |

(Continued)

FOREIGN PATENT DOCUMENTS

EP  0615283 A1  9/1994
EP  1387402 A2  2/2004

(Continued)

OTHER PUBLICATIONS

International Search Report, PCT/US2008/011271, dated Mar. 27, 2009.

(Continued)

*Primary Examiner* — Chris Chu
(74) *Attorney, Agent, or Firm* — Lerner, David, Littenberg, Krumholz & Mentlik, LLP (57) ABSTRACT

A packaged microelectronic assembly includes a microelectronic element having a front surface and a plurality of first solid metal posts extending away from the front surface. Each of the first posts has a width in a direction of the front surface and a height extending from the front surface, wherein the height is at least half of the width. There is also a substrate having a top surface and a plurality of second solid metal posts extending from the top surface and joined to the first solid metal posts.

32 Claims, 6 Drawing Sheets

(56) References Cited

U.S. PATENT DOCUMENTS

| | | | |
|---|---|---|---|
| 6,852,564 B2 * | 2/2005 | Ohuchi et al. | 438/68 |
| 6,869,750 B2 | 3/2005 | Zhang et al. | |
| 6,875,638 B2 * | 4/2005 | Yoneda et al. | 438/125 |
| 6,888,255 B2 * | 5/2005 | Murtuza et al. | 257/778 |
| 6,906,418 B2 | 6/2005 | Hiatt et al. | |
| 6,956,165 B1 * | 10/2005 | Hata et al. | 174/521 |
| 6,965,166 B2 | 11/2005 | Hikita et al. | |
| 6,995,044 B2 | 2/2006 | Yoneda et al. | |
| 6,995,469 B2 * | 2/2006 | Hatakeyama | 257/738 |
| 7,125,789 B2 | 10/2006 | Tellkamp et al. | |
| 7,183,190 B2 | 2/2007 | Saijo et al. | |
| 7,214,887 B2 * | 5/2007 | Higashida et al. | 174/260 |
| 7,382,049 B2 | 6/2008 | Ho et al. | |
| 7,569,935 B1 * | 8/2009 | Fan | 257/737 |
| 7,598,613 B2 * | 10/2009 | Tanida et al. | 257/737 |
| 7,829,265 B2 * | 11/2010 | Kitada et al. | 430/311 |
| 8,115,310 B2 | 2/2012 | Masumoto et al. | |
| 2002/0090756 A1 | 7/2002 | Tago et al. | |
| 2002/0155661 A1 | 10/2002 | Massingill et al. | |
| 2002/0185735 A1 | 12/2002 | Sakurai et al. | |
| 2003/0001286 A1 | 1/2003 | Kajiwara et al. | |
| 2003/0094700 A1 | 5/2003 | Aiba et al. | |
| 2003/0127734 A1 | 7/2003 | Lee et al. | |
| 2003/0189260 A1 | 10/2003 | Tong et al. | |
| 2003/0234453 A1 | 12/2003 | Liu et al. | |
| 2004/0132533 A1 | 7/2004 | Leifer | |
| 2004/0135243 A1 | 7/2004 | Aoyagi | |
| 2004/0155358 A1 | 8/2004 | Iijima | |
| 2006/0220259 A1 | 10/2006 | Chen et al. | |
| 2007/0045869 A1 | 3/2007 | Ho et al. | |
| 2007/0164447 A1 | 7/2007 | Ho et al. | |
| 2007/0230153 A1 | 10/2007 | Tanida et al. | |
| 2008/0067661 A1 | 3/2008 | Kawabata | |
| 2009/0091024 A1 | 4/2009 | Zeng et al. | |
| 2009/0188706 A1 | 7/2009 | Endo | |

FOREIGN PATENT DOCUMENTS

| | | | |
|---|---|---|---|
| JP | 62117346 A | 5/1987 | |
| JP | 7211722 A | 8/1995 | |
| JP | 08031835 | 2/1996 | |
| JP | 2001118872 A | 4/2001 | |
| JP | 2003051665 A | 2/2003 | |
| JP | 2003092472 A | 3/2003 | |
| JP | 2004349390 A | 12/2004 | |
| JP | 2007266555 A | 10/2007 | |
| JP | 20009045371 A2 | 4/2009 | |
| WO | 2006057097 A1 | 6/2006 | |

OTHER PUBLICATIONS

U.S. Appl. No. 12/965,192.

Chinese Office Action for Application No. 2008801177143 dated Jul. 18, 2012.

Suppplementary Partial European Search Report for Application No. EP 08835829 dated Feb. 21, 2012.

Extended European Search Report for Application No. EP 08835829.6 dated Feb. 28, 2012.

European Office Action for Application No. 08835829.6 dated Oct. 19, 2012.

Japanese Office Action for Application No. 2010-526972 dated Jan. 25, 2013.

Chinese Office Action for Application No. 200880117714.3 dated Jan. 29, 2013.

International Search Report for Application No. PCT/US2011/063953 dated Mar. 29, 2012.

Partial European Search Report for Application No. EP13164353 dated Aug. 7, 2013.

Yamada H et al., "A fine pitch and high aspect ratio bump array for flip-chip interconnection", Proceedings of The International Electronic Manufacturing Technology Symposium, Baltimore, USA, Sep. 28-30, 1992, New York, USA, IEEE. vol. SYMP. 13, Sep. 28, 1998, pp. 288-292, XP010259441.

Yamada H et al., "A fine pitch and high aspect ratio bump fabrication process for flip-chip interconnection", Proceedings of The International Electronic Manufacturing Technology Symposium, Omiya, Japan, Dec. 4-6, 1995, New York, USA, IEEE, Dec. 4, 1995, pp. 121-124, XP010195564.

* cited by examiner

FLIP CHIP INTERCONNECTION WITH DOUBLE POST

CROSS-REFERENCE TO RELATED APPLICATIONS

This invention claims the benefit of the filing date of U.S. Provisional Patent Application No. 60/995,849 filed Sep. 28, 2007, the disclosure of which is hereby incorporated herein by reference.

BACKGROUND OF THE INVENTION

The present invention relates to microelectronic apparatuses and packaging microelectronic components for microelectronic packages and assemblies.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

In one face of the semiconductor chip is fabricated the active circuitry. To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as gold or aluminum, around 0.5 µm thick. The size of the bond pads will vary with the device type but will typically measure tens to hundreds of microns on a side.

Flip-chip interconnection is a commonly used scheme for conductively connecting bond pads on the semiconductor chip to contact pads on a substrate. In flip-chip interconnection, lumps of metal are typically placed on each bond pad. The die is then inverted so the metal lumps provide both the electrical pathway between the bond pads and the substrate as well as the mechanical attachment of the die to the substrate.

There are many variations of the flip-chip process, but one common configuration is to use solder for the lumps of metal and fusion of the solder as the method of fastening it to the bond pads and the substrate. When it melts the solder flows to form truncated spheres.

Despite the advances that have been made in flip chip interconnections, there is still need for improvements in order to minimize the package thickness, while enhancing joint reliability. These attributes of the present invention are achieved by the construction of the microelectronic packages as described hereinafter.

SUMMARY OF THE INVENTION

According to an embodiment of the invention, there is a packaged microelectronic element that includes a microelectronic element having a front surface and a plurality of first solid metal bumps extending away from the front surface. Each of the posts has a width in a direction of the front surface and a height extending from the front surface, wherein the height is at least half of the width. There is also a substrate that has a top surface and a plurality of second solid metal posts extending from the top surface and joined to the first solid metal posts with a fusible metal. The second posts have top surfaces and edge surfaces extending abruptly away from said top surface of the substrate.

The posts of this embodiment may be etched and comprised essentially of copper. Additionally, underbump metallizations may underly the first bumps. A ratio of a diameter of the first posts to a pitch between the first posts may be no more than 3:4. Furthermore, a diameter of the first posts may be less than one-half of a pitch between each of the first posts.

In another embodiment, a packaged microelectronic element comprises a microelectronic element having a front surface and a plurality of first solid metal posts extending away from the front surface. Each post has a width in a direction of the front surface and a height extending from the front surface, wherein the height is at least half the width. There is also a substrate having a top surface and a plurality of second solid metal posts extending from the top surface and joined to the first solid metal posts. In this embodiment, the first and second posts are diffusion-bonded together.

The ratio of a diameter of the first posts to a pitch between the first posts may be no more than 3:4. The distance between the front surface of the microelectronic element and the top surface of the substrate may be greater than 80 microns. Furthermore, each of the first posts may have a diameter that is equal to a diameter of each of the second metal posts. Finally, an underfill material may be deposited between the front surface of the microelectronic element and the top surface of the substrate.

In still another embodiment, a packaged microelectronic element includes a microelectronic element having a front surface and a plurality of first solid metal posts extending away from the front surface. Each post has a width in a direction of the front surface and a height extending from the front surface. The posts consist essentially of metal other than solder, lead, or tin. There is also a substrate that has a top surface. A plurality of second solid metal posts extend from the top surface and are joined to the first solid metal posts with a fusible metal. A ratio of a diameter of the first or second solid metal posts to a pitch between the plurality of the first or second solid metal posts is no more than 3:4.

In an alternative to this embodiment, the substrate may be a multilayer substrate. Additionally, a diameter of the first posts may be less than one-half of a pitch between each of the first posts. Furthermore, each of said first posts may have a diameter that is equal to a diameter of the second metal posts.

In another embodiment, a packaged microelectronic element includes a microelectronic element having a front surface and a plurality of first solid metal posts extending away from the front surface. Each post has a width in a direction of the front surface and a height extending from the front surface. There is a substrate that has a top surface. A plurality of second solid metal posts extend from the top surface and are joined to the first solid metal posts. A pitch of the first posts ranges between 50 and 200 microns and a distance between the bottom surface of the microelectronic element and the top surface of the substrate is greater than 80 microns.

In an alternative of this embodiment, a fusible metal may be used to join the second posts to the first posts. Each of the first posts may have a diameter that is equal to a diameter of the second metal posts. Furthermore, a diameter of the first posts may be less than one-half of a pitch between each of the first posts.

In another embodiment, a packaged microelectronic element includes a microelectronic element, a substrate, and a plurality of pillars extending between the microelectronic element and the substrate. Each of the plurality of pillars comprise a first metal post portion attached to the microelectronic element, a second metal post portion attached to the substrate, and a metal fusion portion, wherein the first and second metal portions are joined together. The plurality of pillars having a length not less than 50 microns. The height of the first and second metal post portions is at least half of the width.

In an alternative of this embodiment, a distance between the front surface of the microelectronic element and the top surface of the substrate is greater than 80 microns. The substrate may also be a multilayer substrate.

Each of the first posts may have a diameter that is equal to a diameter of the second metal posts. A diameter of the first posts may be less than one-half of a pitch between each of the first posts. Additionally, the first or second posts may be etched.

A method of fabricating a packaged microelectronic element assembly includes providing a microelectronic element having a plurality of conductive posts extending away from a first surface of a microelectronic element. The posts have top surfaces and edge surfaces extending abruptly away from the top surfaces. A fusible metal cap is attached to an end of each of the plurality of conductive posts. Another next step includes at least substantially aligning the posts of the microelectronic element with a plurality of posts extending from a first surface of a substrate. The last step includes joining the posts of the microelectronic element with the posts of the substrate.

In an alternative method, step (c) includes heating the fusible metal to a melting temperature, wherein the fusible metal flows onto exposed portions of the edge surfaces of the posts.

In another alternative method, a passivation layer and an underbump metallization layer are deposited over the microelectronic element.

The following paragraphs describe various embodiments herein:

1. A packaged microelectronic element, comprising:
a microelectronic element having a front surface and a plurality of first solid metal bumps extending away from the front surface, each post having a width in a direction of the front surface and a height extending from the front surface, wherein the height is at least half said width; and
a substrate having a top surface and a plurality of second solid metal posts extending from the top surface and joined to the first solid metal posts with a fusible metal, said posts having top surfaces and edge surfaces extending abruptly away from said top surfaces.

2. The packaged microelectronic element of paragraph 1, wherein said first bumps or second posts include copper.

3. The packaged microelectronic element of paragraph 1, wherein said fusible metal is selected from the group consisting essentially of solder, tin, or a eutectic material.

4. The packaged microelectronic element of paragraph 1, wherein a pitch between said first bumps ranges from 50 to 200 microns.

5. The packaged microelectronic element of paragraph 1, wherein a ratio of a diameter of said first bumps to a pitch between said first posts is no more than 3:4

6. The packaged microelectronic element of paragraph 1, wherein a distance between said front surface of said microelectronic element and said top surface of said substrate is greater than 80 microns.

7. The packaged microelectronic element of paragraph 1, further comprising underbump metallizations underlying said first bumps.

8. The packaged microelectronic element of paragraph 1, wherein said substrate is a multilayer substrate.

9. The packaged microelectronic element of paragraph 1, wherein each of said first bumps has a diameter that is equal to a diameter of said second posts.

10. The packaged microelectronic element of paragraph 1, wherein a diameter of said first bumps are less than one-half of a pitch between each of said first posts.

11. The packaged microelectronic element of paragraph 1, further comprising an underfill material between said front surface of said microelectronic element and said top surface of said substrate.

12. The packaged microelectronic element of paragraph 1, further comprising a layer of solder mask overlying said front surface of said microelectronic element.

13. The packaged microelectronic element of paragraph 1, wherein said first or second posts are etched.

14. The packaged microelectronic element of paragraph 1, wherein said first or second posts are electroplated.

15. The packaged microelectronic element of paragraph 1, wherein said front surface is an active surface.

16. The packaged microelectronic element of paragraph 1, wherein traces extend along said front surface of said microelectronic element.

17. The packaged microelectronic element of paragraph 1, wherein said substrate further comprises a second surface, and wherein vias extend through said substrate so as to provide a connection between said second posts and circuitry exposed at said bottom surface of said substrate.

18. A packaged microelectronic element, comprising:
a microelectronic element having a front surface and a plurality of first solid metal posts extending away from the front surface, each post having a width in a direction of the front surface and a height extending from the front surface, wherein the height is at least half said width; and
a substrate having a top surface and a plurality of second solid metal posts extending from the top surface and joined to the first solid metal posts, wherein said first and second posts are diffusion-bonded together.

19. The packaged microelectronic element of paragraph 18, wherein said first or second posts include copper.

20. The packaged microelectronic element of paragraph 18, wherein a pitch between said first posts ranges from 50 to 200 microns.

21. The packaged microelectronic element of paragraph 18, wherein a ratio of a diameter of said first posts to a pitch between said first posts is no more than 3:4

22. The packaged microelectronic element of paragraph 18, wherein a distance between said front surface of said microelectronic element and said top surface of said substrate is greater than 80 microns.

23. The packaged microelectronic element of paragraph 18, further comprising underbump metallizations underlying said first posts.

24. The packaged microelectronic element of paragraph 18, wherein said substrate is a multilayer substrate.

25. The packaged microelectronic element of paragraph 18, wherein each of said first posts has a diameter that is equal to a diameter of each of said second metal posts.

26. The packaged microelectronic element of paragraph 18, wherein a diameter of said first posts is less than one-half of a pitch between each of said first posts.

27. The packaged microelectronic element of paragraph 18, further comprising an underfill material between said front surface of said microelectronic element and said top surface of said substrate.

28. The packaged microelectronic element of paragraph 18, further comprising a layer of solder mask overlying said front surface of said microelectronic element.

29. The packaged microelectronic element of paragraph 18, wherein said first or second posts are etched.

30. The packaged microelectronic element of paragraph 18, wherein said first or second posts are electroplated.

31. The packaged microelectronic element of paragraph 18, wherein said front surface is an active surface.

32. The packaged microelectronic element of paragraph 18, wherein traces extend along said front surface of said microelectronic element.

33. The packaged microelectronic element of paragraph 18, wherein said substrate further comprises a second surface, and wherein vias extend through said substrate so as to provide a connection between said second posts and circuitry exposed at said bottom surface of said substrate.

34. A packaged microelectronic element, comprising:
a microelectronic element having a front surface and a plurality of first solid metal posts extending away from the front surface, each post having a width in a direction of the front surface and a height extending from the front surface, said posts consist essentially of metal other than solder, lead, or tin; and
a substrate having a top surface and a plurality of second solid metal posts extending from the top surface and joined to the first solid metal posts with a fusible metal,
wherein a ratio of a diameter of said first or second solid metal posts to a pitch between said plurality of first or second solid metal posts is no more than 3:4.

35. The packaged microelectronic element of paragraph 34, wherein said first or second posts include copper.

36. The packaged microelectronic element of paragraph 34, wherein said fusible metal is selected from the group consisting essentially of solder, tin, or a eutectic material.

37. The packaged microelectronic element of paragraph 34, wherein a pitch between said first posts ranges from 50 to 200 microns.

38. The packaged microelectronic element of paragraph 34, wherein a distance between said front surface of said microelectronic element and said top surface of said substrate is greater than 80 microns.

39. The packaged microelectronic element of paragraph 34, further comprising underbump metallizations underlying said first posts.

40. The packaged microelectronic element of paragraph 34, wherein said substrate is a multilayer substrate.

41. The packaged microelectronic element of paragraph 34, wherein each of said first posts has a diameter that is equal to a diameter of each of said second metal posts.

42. The packaged microelectronic element of paragraph 34, wherein a diameter of said first posts is less than one-half of a pitch between each of said first posts.

43. The packaged microelectronic element of paragraph 34, further comprising an underfill material between said front surface of said microelectronic element and said top surface of said substrate.

44. The packaged microelectronic element of paragraph 34, further comprising a layer of solder mask overlying said front surface of said microelectronic element.

45. The packaged microelectronic element of paragraph 34, wherein said first or second posts are etched.

46. The packaged microelectronic element of paragraph 34, wherein said first or second posts are electroplated.

47. The packaged microelectronic element of paragraph 34, wherein said front surface is an active surface.

48. The packaged microelectronic element of paragraph 34, wherein traces extend along said front surface of said microelectronic element.

49. The packaged microelectronic element of paragraph 34, wherein said substrate further comprises a second surface, and wherein vias extend through said substrate so as to provide a connection between said second posts and circuitry exposed at said bottom surface of said substrate.

50. A packaged microelectronic element comprising:
a microelectronic element having a front surface and a plurality of first solid metal posts extending away from the front surface, each post having a width in a direction of the front surface and a height extending from the front surface; and
a substrate having a top surface and a plurality of second solid metal posts extending from the top surface and joined to the first solid metal posts, wherein a pitch of said first posts ranges between 50 and 200 microns and a distance between said bottom surface of said microelectronic element and said top surface of said substrate is greater than 80 microns.

51. The packaged microelectronic element of paragraph 50, wherein said first or second posts include copper.

52. The packaged microelectronic element of paragraph 50, wherein a fusible metal is used to join said second posts to said first posts.

53. The packaged microelectronic element of paragraph 50, wherein said fusible metal is selected from the group consisting essentially of solder, tin, or a eutectic material.

54. The packaged microelectronic element of paragraph 50, wherein a ratio of a diameter of said first posts to a pitch between said first posts is no more than 3:4

55. The packaged microelectronic element of paragraph 50, wherein a distance between said front surface of said microelectronic element and said top surface of said substrate is greater than 80 microns.

56. The packaged microelectronic element of paragraph 50, further comprising underbump metallizations underlying said first posts.

57. The packaged microelectronic element of paragraph 50, wherein said substrate is a multilayer substrate.

58. The packaged microelectronic element of paragraph 50, wherein each of said first posts has a diameter that is equal to a diameter of said second metal posts.

59. The packaged microelectronic element of paragraph 50, wherein a diameter of said first posts is less than one-half of a pitch between each of said first posts.

60. The packaged microelectronic element of paragraph 50, further comprising an underfill material between said front surface of said microelectronic element and said top surface of said substrate.

61. The packaged microelectronic element of paragraph 50, further comprising a layer of solder mask overlying said front surface of said microelectronic element.

62. The packaged microelectronic element of paragraph 50, wherein said first or second posts are etched.

63. The packaged microelectronic element of paragraph 50, wherein said first or second posts are electroplated.

64. The packaged microelectronic element of paragraph 50, wherein said front surface is an active surface.

65. The packaged microelectronic element of paragraph 50, wherein traces extend along said front surface of said microelectronic element.

66. The packaged microelectronic element of paragraph 50, wherein said substrate further comprises a second surface, and wherein vias extend through said substrate so as to provide a connection between said second posts and circuitry exposed at said bottom surface of said substrate.

67. A packaged microelectronic element comprising:
a microelectronic element having a front surface and a plurality of first solid metal posts extending away from the front surface, each post having a width in a direction of the front surface and a height extending from the front surface; and a substrate having a top surface and a plurality of second solid metal posts extending from the top surface and joined to the first solid metal posts, wherein said plurality of said first and second solid metal posts consist essentially of copper.

68. The packaged microelectronic element of paragraph 67 wherein a fusible metal is used to join the first and second posts.

69. The packaged microelectronic element of paragraph 68, wherein said fusible metal is selected from the group consisting essentially of solder, tin, or a eutectic material.

70. The packaged microelectronic element of paragraph 67, wherein a pitch between said first posts ranges from 50 to 200 microns.

71. The packaged microelectronic element of paragraph 67, wherein a ratio of a diameter of said first posts to a pitch between said first posts is no more than 3:4

72. The packaged microelectronic element of paragraph 67, wherein a distance between said front surface of said microelectronic element and said top surface of said substrate is greater than 80 microns.

73. The packaged microelectronic element of paragraph 67, further comprising underbump metallizations underlying said first posts.

74. The packaged microelectronic element of paragraph 67, wherein said substrate is a multilayer substrate.

75. The packaged microelectronic element of paragraph 67, wherein each of said first posts has a diameter that is equal to a diameter of said second metal posts.

76. The packaged microelectronic element of paragraph 67, wherein a diameter of said first posts is less than one-half of a pitch between each of said first posts.

77. The packaged microelectronic element of paragraph 67, further comprising an underfill material between said front surface of said microelectronic element and said top surface of said substrate.

78. The packaged microelectronic element of paragraph 67, further comprising a layer of solder mask overlying said front surface of said microelectronic element.

79. The packaged microelectronic element of paragraph 67, wherein said first or second posts are etched.

80. The packaged microelectronic element of paragraph 67, wherein said first or second posts are electroplated.

81. The packaged microelectronic element of paragraph 67, wherein said front surface is an active surface.

82. The packaged microelectronic element of paragraph 67, wherein traces extend along said front surface of said microelectronic element.

83. The packaged microelectronic element of paragraph 67, wherein said substrate further comprises a second surface, and wherein vias extend through said substrate so as to provide a connection between said second posts and circuitry exposed at said bottom surface of said substrate.

84. A packaged microelectronic element comprising:

a microelectronic element; a substrate; and, a plurality of pillars extending between said microelectronic element and said substrate, each of said plurality of pillars comprising a first metal post portion attached to said microelectronic element, a second metal post portion attached to said substrate, and a metal fusion portion, wherein said first and second metal portions are joined together, said plurality of pillars having a length not less than 50 microns, and said height of said first and second metal post portions is at least half of said width.

85. The packaged microelectronic element of paragraph 84, wherein said first or second posts include copper.

86. The packaged microelectronic element of paragraph 84, wherein a pitch between said first posts ranges from 50 to 200 microns.

87. The packaged microelectronic element of paragraph 84, wherein a ratio of a diameter of said first posts to a pitch between said first posts is no more than 3:4

88. The packaged microelectronic element of paragraph 84, wherein a distance between said front surface of said microelectronic element and said top surface of said substrate is greater than 80 microns.

89. The packaged microelectronic element of paragraph 84, further comprising underbump metallizations underlying said first posts.

90. The packaged microelectronic element of paragraph 84, wherein said substrate is a multilayer substrate.

91. The packaged microelectronic element of paragraph 84, wherein each of said first posts has a diameter that is equal to a diameter of said second metal posts.

92. The packaged microelectronic element of paragraph 84, wherein a diameter of said first posts is less than one-half of a pitch between each of said first posts.

93. The packaged microelectronic element of paragraph 84, further comprising an underfill material between said front surface of said microelectronic element and said top surface of said substrate.

94. The packaged microelectronic element of paragraph 84, further comprising a layer of solder mask overlying said front surface of said microelectronic element.

95. The packaged microelectronic element of paragraph 84, wherein said first or second posts are etched.

96. The packaged microelectronic element of paragraph 84, wherein said first or second posts are electroplated.

97. The packaged microelectronic element of paragraph 84, wherein said front surface is an active surface.

98. The packaged microelectronic element of paragraph 84, wherein traces extend along said front surface of said microelectronic element.

99. The packaged microelectronic element of paragraph 84, wherein said substrate further comprises a second surface, and wherein vias extend through said substrate so as to provide a connection between said second posts and circuitry exposed at said bottom surface of said substrate.

DETAILED DESCRIPTION

Figure 1A:
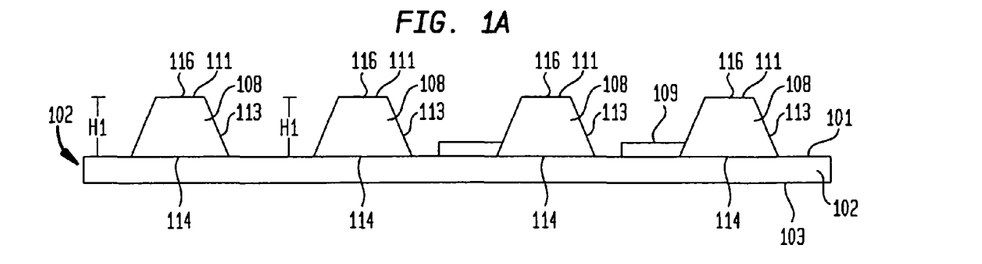
FIGS. 1A and 1B are sectional views of the components of a microelectronic assembly in accordance with one embodiment.
Figure 1B:
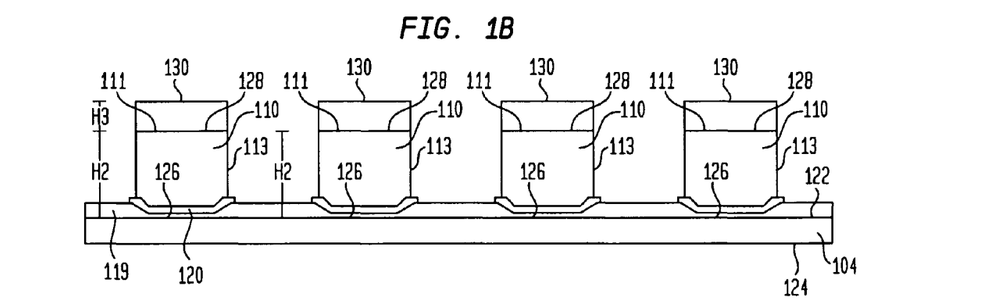
Figure 1C:
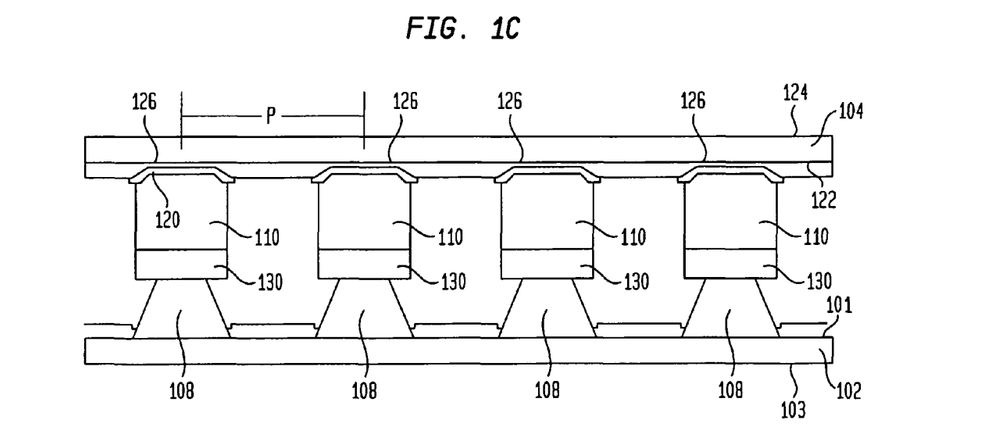
FIG. 1C is a sectional view illustrating FIGS. 1A and 1B being joined together.
Figure 2:
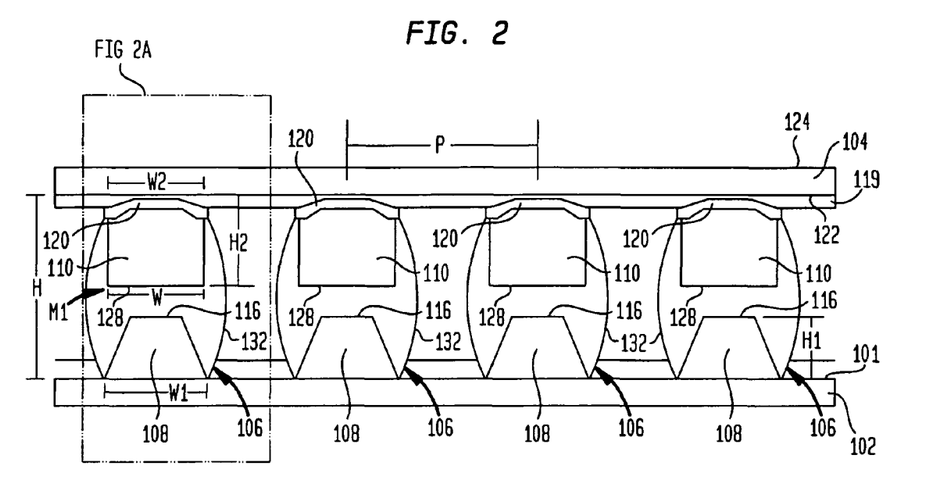
FIG. 2 is a sectional view illustrating a microelectronic assembly in accordance with the embodiment of FIGS. 1A-1C.

Reference is now made to FIGS. 1A-1C, which illustrate cross-sectional views of the components of the packaged microelectronic assembly 100 shown in FIG. 2. As shown, the packaged microelectronic assembly 100 includes a substrate 102, a microelectronic element 104 in a face down or flip chip position, and conductive columns 106 joining the substrate with the microelectronic element. The conductive columns include conductive bumps or posts 108 which protrude above a fact 105 of the substrate 102 that are aligned with conductive bumps or posts 110 protruding above a face 107 of the microelectronic element 104. The conductive columns 106 provide for increased height for chip-on-substrate packaging by increasing the standoff or vertical distance between the microelectronic element 104 and substrate 102, while at the same time allowing for a decrease in the center-to-center horizontal distance or pitch P between conductive columns 106. As will be discussed in further detail below, the ability to increase the distance between the substrate 102 and the microelectronic element 104 may help reduce stress at the conductive columns, may help ease the application of underfill material 112 (see FIG. 2A), and allow for a greater variety of underfills to be used.

With reference to FIG. 1A, the substrate 102 preferably includes a dielectric element 102A. The dielectric element 102A having a top surface 101 and an oppositely facing bottom surface 103. A plurality of conductive traces 109 may extend along the top or bottom surfaces or both. The dielectric element 102A may be rigid or flexible. The dielectric element 102 may be comprised of a polyimide or other polymeric sheet. Although the thickness of the dielectric element 102 may vary, the dielectric element 102A most typically up to 2 millimeters. The substrate 102 may include other conductive elements such as external contacts (not shown) exposed at the bottom surface 103. The bond traces may be created using the methods illustrated in commonly assigned U.S. Published application Ser. No. 11/014,439, the disclosure of which is hereby incorporated by reference herein. In the particular embodiment illustrated, the conductive elements (not shown) are disposed on the top surface 101 of substrate 102. However, in other embodiments, the conductive elements may also extend along the bottom surface 103 of substrate 102; on both the top and bottom surfaces 101, 103 or within the interior of the substrate 102. Thus, as used in this disclosure, a statement that a first feature is disposed "on" a second feature should not be understood as requiring that the first feature lie on a surface of the second feature. Additionally, descriptive words such as "top," "bottom," "upper," and "lower" are used only for illustration purposes.

Figure 2A:
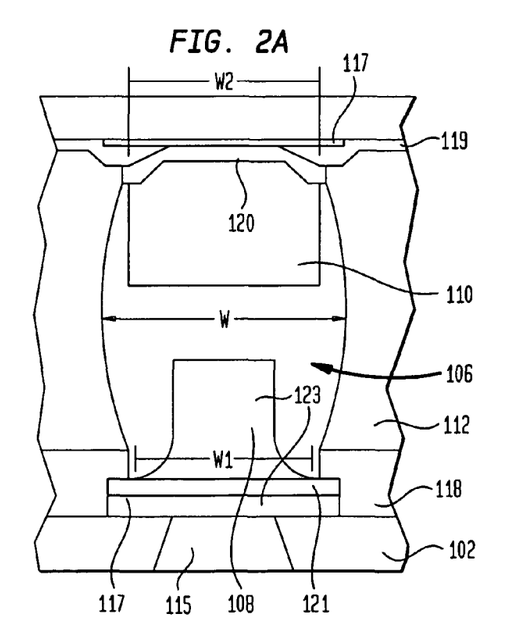
FIG. 2A is an exploded sectional view of a portion of FIG. 2.

Solid metal bumps or conductive posts 108 also extend from the top surface 101 of the substrate 102 to form the first portion of the conductive columns 106 (FIGS. 2 and 2A). The conductive posts 108 have top surfaces 111 and edge surfaces 113 extending abruptly away from the top surface of the substrate 102 such that a distinct angle is created where the edge surfaces 113 meet the top surfaces 101 of the substrate 102. For example, in the embodiment shown, an angle greater than 90 degrees is created between the top surfaces 101 of the substrate 102 and the edge surfaces 113 of the conductive posts 108. The angle will differ based upon the shape of the conductive post 108. For example, a cylindrical post may have an angle of 90 degrees between the top surface 101 of the substrate 102 and the conductive post 108. Exemplary processes and posts are described in Provisional Applications Nos. 60/875,730, filed on Dec. 19, 2006, and entitled Chip Capacitor Embedded PWB; 60/964,916, filed on Aug. 15, 2007, and entitled Multilayer Substrate with Interconnection Vias and Method of Manufacturing the Same; 60/964,823 filed on Aug. 15, 2007, and entitled Interconnection Element with Posts Formed by Plating; the disclosures all of which are incorporated herein by reference. For example, the conductive posts 108 may be formed by etching processes, as described in more detail herein. Alternatively, conductive posts 108 may be formed by electroplating, in which posts 108 are formed by plating a metal onto a base metal layer through openings patterned in a dielectric layer such as a photoresist layer.

The dimensions of the conductive posts 108 can vary over a significant range, but most typically the height H1 of each conductive post 108 extending from the top surface 103 of dielectric element 102A is at least 50 microns and can extend up to 300 micrometers. These conductive posts 108 may have a height H1 that is greater than its diameter or width W1. However, the height H1 may also be smaller than the width W1, such as at least half the size of the width W1.

The conductive posts 108 may be made from any electrically conductive material, such as copper, copper alloys, gold and combinations thereof. The conductive posts 108 may include at least an exposed metal layer that is wettable by solder. For example, the posts may be comprised of copper with a layer of gold at the surfaces of the posts. Additionally, the conductive posts 108 may include at least one layer of metal having a melting temperature that is greater than a melting temperature of the solder to which it will be joined. For example, such conductive posts 108 would include a layer of copper or be formed entirely of copper.

The conductive posts 108 may also take on many different shapes, including frustoconical. The base 114 and tip 116 of each of the conductive posts 108 may be substantially circular or have a different shape, e.g. oblong. The bases 114 of the conductive posts 108 typically are about 50-300 μm in diameter, whereas the tips 116 typically are about 25-200 μm in diameter. Each conductive post 108 may have a base 114 adjacent the dielectric substrate 102 and a tip 116 remote from the dielectric substrate. Additionally, the height H1 of the conductive posts from the top surface 101 of the dielectric element 102A (excluding any solder mask) typically ranges from as little as 30 μm up to 200 μm.

As shown, solder mask 118 (FIG. 2) may be disposed over the substrate 102 and adjacent the conductive posts 108. The solder mask 118 helps to prevent solder overflow and bridging between adjacent columns 106 during the reflow phase.

Referring to FIG. 1B, the microelectronic element 104 has a front surface 122 and a rear surface 124. The microelectronic element 104 is preferably a semiconductor chip or the like prior to its packaging and interconnection with another element. For example, the microelectronic element is a bare die.

Exemplary conductive posts and methods of making conductive posts capable of extending from a microelectronic element or the like are described on the website of Advanpak Solutions Pte. Ltd. ("Advanpak"), as well as in U.S. Pat. Nos. 6,681,982; 6,592,109; and 6,578,754 that are assigned to Advanpak, and the disclosures of which are incorporated herein by reference. For example, the conductive posts 110 may be formed by etching processes. Alternatively, conductive posts 110 may be formed by electroplating, in which posts 110 are formed by plating a metal onto a base metal layer through openings patterned in a photoresist layer. Like the conductive posts 108 extending from the substrate, the posts 110 extending from the microelectronic element 104 may have top surfaces 111 and edge surfaces 113 extending abruptly away from said top surface 122 of the microelectronic element such that a distinct angle is created between the microelectronic element and the conductive posts.

To provide a metal contact between the conductive posts 110 and the microelectronic element 104, an underbump metallization layer 120 may be provided on the front surface 122 of the microelectronic element 104. The underbump metallization layer 120, is typically composed of a material including titanium, titanium-tungsten, chromium. The underbump metallization layer 120 operates as the conducting metal contact for the conductive columns 106. A passivation layer 119 may also be provided on the front surface 122 of the microelectronic element 104 between the microelectronic element 104 and the underbump metallization layer 120 using known methods in the art.

Referring to FIGS. 1B, 1C, and 2, the dimensions of the conductive posts 110 extending from the microelectronic element 104 may also vary over a significant range, but most typically the height H2 of each conductive post 110 is not less than 50 microns. The conductive posts 110 may have a height H2 that is greater than its width W2. However, the height may also be smaller than the width W2, such as at least half the size of the width.

The conductive posts 110 are preferably made from copper or copper alloys, but may also include other electrically conductive materials, such as gold or combinations of gold and copper. Additionally, the conductive posts 110 may include at least one layer of metal having a melting temperature that is greater than a melting temperature of the solder to which it will be joined. For example, such conductive posts would include a layer of copper or be formed entirely of copper.

In a particular embodiment, the conductive posts 110 can be cylindrical, so that the diameter of the bases 126 of the post and tips 128 of the posts are substantially equal. In one embodiment, the bases 126 and tips 128 of the conductive posts can be about 30-150 µm in diameter. Each conductive post 110 may have a base 126 adjacent the substrate 102 and a tip 128 remote from the substrate 102. Alternatively, the conductive posts 110 may take on a variety of shapes, such as frustroconical, rectangular, or bar-shaped.

A coating or cap of solder 130 may be attached to the tips 128 of the conductive posts 110 or the portion of the conductive posts that are not attached to the microelectronic element 104. The cap of solder 130 can have the same diameter or width W2 of the conductive posts 110 so that it becomes an extension of the conductive post 110. In one example, the cap of solder 130 can have a height H3 ranging from approximately 25-80 µm.

It should be appreciated that the height H2 of the conductive posts 110 extending from the front surface 122 of the microelectronic element 104 can be equal to the height H1 of the conductive posts 108 extending from the top surface 101 of the dielectric element 102A (FIG. 1A). However, the heights may alternatively differ, such that the height H2 of the conductive posts 110 can be less than or greater than the height H1 of the conductive posts 108. In a particular illustrative example, the conductive posts 110 extending from the microelectronic element 104 may have a height H2 of 50 µm in length, whereas the conductive posts 108 extending from the substrate may have a height H1 of 55 µm (FIG. 2).

To conductively connect the microelectronic element 104 and substrate 102 together, the conductive posts 110 on the microelectronic element 104 must be connected to the conductive posts 108 on the substrate 102. Referring to FIG. 1C, the microelectronic element 104 is inverted so that the conductive posts 110 of the microelectronic element 104 and the conductive posts 108 of the substrate 102 are aligned with one another and brought into close proximity. The cap of solder 130 on the microelectronic element 104 is reflowed to allow the solder to wet the surfaces of the conductive posts 110 on the microelectronic element 104 and the conductive posts 108 on the substrate 102. As shown in FIGS. 2-2A, the solder will wet to the exposed surfaces of the conductive posts and create a conductive column 106 that extends from the microelectronic element to the substrate. The increased surface areas of the conductive columns 108, 110 on the microelectronic element 104 and substrate 102 to which the solder is joined can help reduce the current density at the solder interface. Such decrease in current density may help reduce electromigration and provide for greater durability.

As shown, the conductive columns 106 include solder conductively interconnecting the conductive posts. The standoff or height H of the conductive columns extending between the base of the conductive post extending from the microelectronic element and the exposed portions of the base extending from the substrate in one example ranges 80-100 µm.

As shown in FIGS. 2, 2A, the walls 132 of the conductive columns 106 can be convex or barrel shaped, wherein the midpoint region M of the conductive column (i.e., between the conductive posts 110 of the microelectronic element and conductive posts 108 of the substrate) has a width W that is greater than the widths W1, W2 of the portions of the conductive columns 106 respectively adjacent the top surface 101 of the substrate 102 and front surface 102 of the microelectronic element 104.

As further shown in FIG. 2A, contact pads 117 may be formed on the microelectronic element 104 and substrate 102 using known methods. In one embodiment, the lower post 108 that extends away from the substrate 102, as well as the lower contact pad 117 may be formed by separate etching steps, such as disclosed in International Application PCT No. WO 2008/076428, which published on Jun. 28, 2008 and the disclosure of which is incorporated herein by reference. For example, a tri-metal substrate with top and bottom metal layers 123 and in intermediate etch stop layer or interior metal layer 121 may be utilized to create the conductive post 108 and contact pad 117. In one such process, an exposed metal layer of a three-layer or more layered metal structure is etched in accordance with a photolithographically patterned photoresist layer to form the conductive post 108, the etching process stopping on an interior metal layer 121 of the structure. The interior metal layer 121 includes one or more metals different from that of the top and bottom metal layers 123, the interior metal layer being of such composition that it is not attached by the etchant used to etch the top metal layer 123. For example, the top metal layer 123 from which the conductive posts 108 are etched consists essentially of copper, the bottom metal layer 123 may also consist essentially of copper, and the interior metal layer 121 consists essentially of nickel. Nickel provides good selectivity relative to copper to avoid the nickel layer from being attached with the metal layer is etched to form conductive posts 108. To form the contact pad 117, another etching step may be conducted in accordance with another photolithographically patterned photoresist layer. The post 108 may be further interconnected with other conductive features such as a via 115, which is, in turn, further interconnected to other conductive features (not shown).

Figure 3:
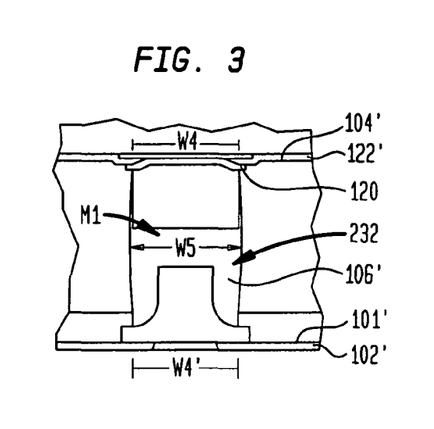
FIG. 3 is a sectional view illustrating a completed microelectronic assembly in accordance with a variation of the embodiment shown in FIG. 2.
Figure 4:
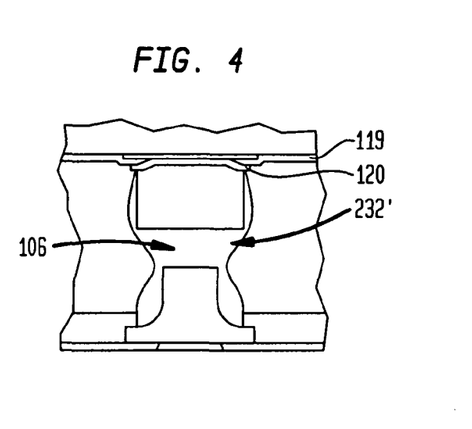
FIG. 4 is a sectional view illustrating a completed microelectronic assembly in accordance with in accordance with a variation of the embodiment shown in FIG. 2.

Referring to FIG. 3, the walls 232 of the conductive columns 106' may also be straight, such that the width W5 is about equal to the widths W4, W4' of the conductive columns 106' respectively adjacent the top surface 101' of the substrate 102' and front surface 122' of the microelectronic element 104'. It should be appreciated that the widths W4, W4' do not need to be equal. Alternatively, the walls 232' of the conductive columns 106' may be concave (see FIG. 4), depending on the desired standoff to be achieved.

The conductive columns 106 in accordance with the present invention allow for a greater standoff height between the dielectric element and the microelectronic element while permitting a significant reduction in the pitch P (see FIGS. 1B, 2) between each of the conductive posts 110 exposed at the front surface 122 of the microelectronic element 104, as well as the pitch P between each of the conductive posts 108 exposed at the top surface 101 of the substrate 102. In one embodiment, the pitch P may be as small as 50 μm or as large as 200 μm. It should be appreciated that by virtue of the fact that the conductive columns 108, 110 are aligned with one another, the pitch P between each of the conductive posts 108, 110 will be equal.

The pitch P may also be a function of the diameter or width W1, W2 of the conductive posts 108, 110, such that the diameter W1, W2 of the base of the conductive posts is up to 75% of the pitch P. In other words, the ratio of the diameter W1, W2 to the pitch P can be up to 3:4. For example, if the pitch P is 145 μm, the diameter W1, W2 of the conductive posts 108, 110 may range up to 108 μm or 75% of the pitch P.

The increased standoff height reduces the strain on Low-k dielectric materials which can be present in the microelectronic element. Additionally, the increased standoff helps to minimize the problems typically associated with small pitches, such as electromigration and crowding. This is due to the fact that the conductive columns 106 are able to wet the surfaces of the conductive posts 108, 110.

Figure 5:
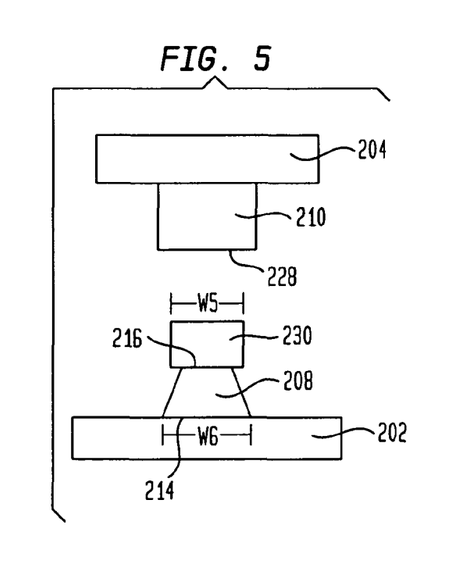
FIG. 5 is a sectional view illustrating the components of a microelectronic assembly in accordance with another embodiment.
Figure 6:
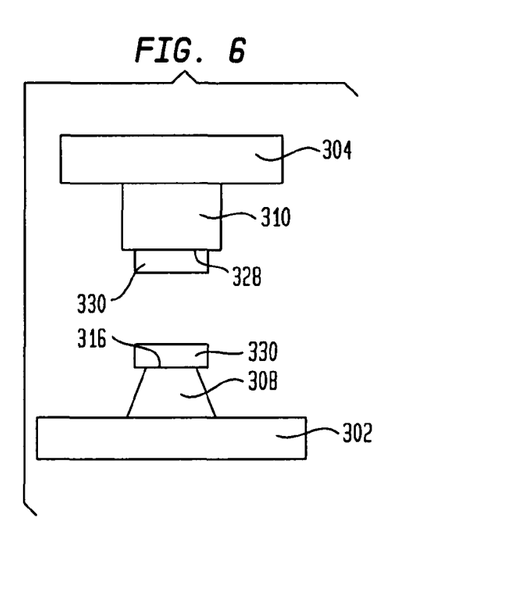
FIG. 6 is a sectional view illustrating components of a microelectronic assembly in accordance with a variation of the embodiment shown in FIG. 5.

Referring to FIGS. 5-6, alternative arrangements for joining the conductive bumps on the microelectronic element with the conductive bumps on the substrate are shown. With reference to FIG. 5, instead of the solder cap 230 being placed at the tip 228 of the conductive post 210 extending from the microelectronic element 204, the solder cap 230 can be placed at the tip 216 of the conductive post 208 extending from the substrate 202. In one embodiment, the width or diameter W5 of the solder cap 230 is roughly equal to the diameter W6 of the base 214 of the conductive post 208. The solder cap 230 therefore extends beyond the tip 216 of the conductive post 208 extends from the substrate 202. Once the solder is reflowed, however, the conductive column will preferably take the shape of the conductive column shown in FIG. 2.

Referring to FIG. 6, in yet another alternative arrangement, solder caps 330 may be placed onto the tip 328 of the conductive posts 310 that extends from the first microelectronic element 304, as well as the tip 316 of the conductive post 308 that extends from the substrate 302. The conductive posts 308, 310 are placed in close proximity to one another. Heat is applied causing the solder caps 330 to reflow, wet, and fuse to the conductive posts 308, 310. Once reflowed, the conductive column 306 will preferably be similar to the conductive column 306 shown in FIG. 2.

Figure 7:
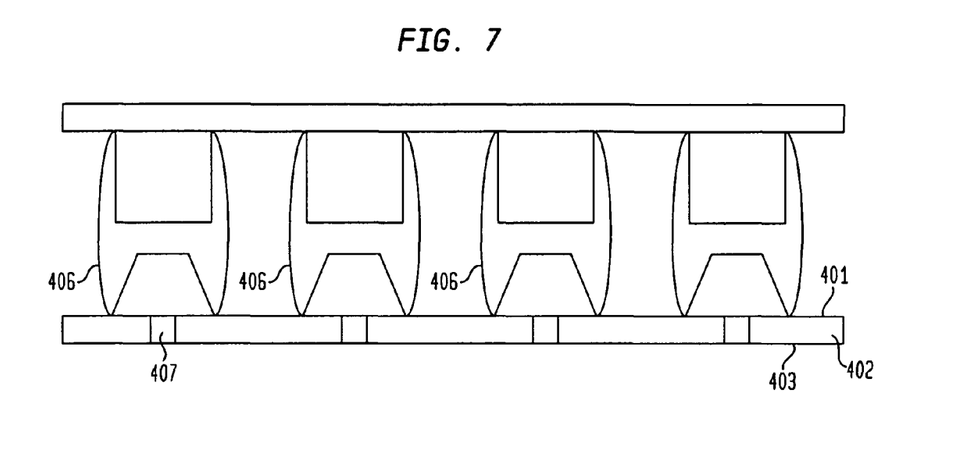
FIG. 7 is a sectional view illustrating a completed microelectronic assembly in accordance with one embodiment.

With reference to FIG. 7, an alternative arrangement for a microelectronic package is shown. The arrangement is similar to the one shown in FIG. 2, the only difference being the absence of a solder mask adjacent the conductive posts extending from the substrate. In this alternative arrangement, vias 407 can be used to conductively connect the conductive columns 406 to electronic circuitry (not shown) exposed at the bottom surface 403 of the substrate 402, as opposed to the top surface 401 of the substrate 402. The use of vias 407 obviates the need for the solder mask.

Figure 8:
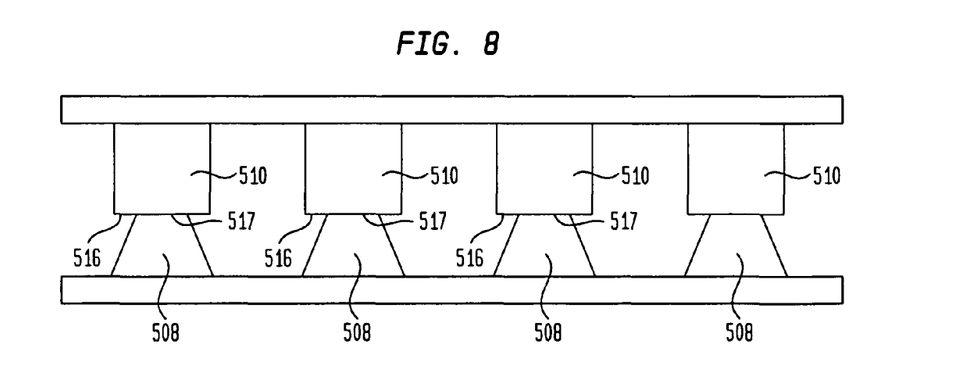
FIG. 8 is a sectional view illustrating a completed microelectronic assembly in accordance with another embodiment.

Referring to FIG. 8, an alternative embodiment is shown, wherein a metal-to-metal bond between the conductive posts is made without the use of solder. Instead, a bond may be formed between the conductive posts 508, 510 by deforming them into engagement with each other. The conductive posts 508, 510 are preferably formed from a malleable material with minimal resilience or spring-back as, for example, substantially pure gold. Furthermore, the conductive posts 508, 510 may be bonded together by eutectic bonding or anodic bonding between the posts and the material of the cover. For example, the tips 516, S17 of the conductive posts 508, 510 may be coated with a small amount of tin, silicon, germanium or other material which forms a relatively low-melting alloy with gold, and the posts may be formed entirely from gold or have a gold coating on their surfaces. When the conductive posts 508, 510 are engaged with one another and then heated, diffusion between the material of conductive posts 508, 510 and the material on the tips 516 of the conductive posts forms an alloy having a melting point lower than the melting points of the individual elements at the interfaces between the posts and walls. With the assembly held at elevated temperature, further diffusion causes the alloying element to diffuse away from the interface, into the bulk of the gold of the posts, thereby raising the melting temperature of the material at the interface and causing the interface to freeze, forming a solid connection between the parts.

Figure 9:
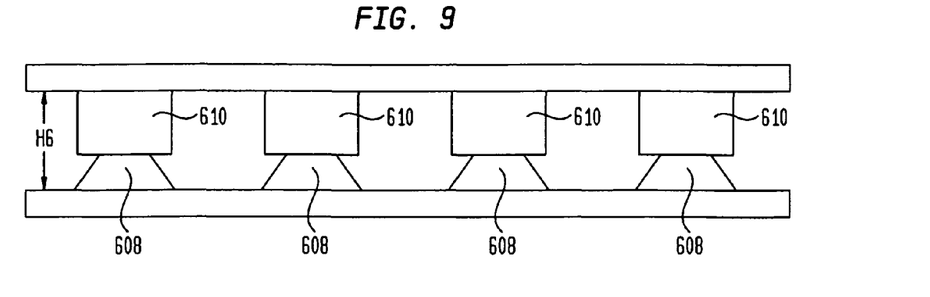
FIG. 9 is a sectional view illustrating a completed microelectronic assembly in accordance with another embodiment.

Referring to FIG. 9, which is identical to FIG. 8, except that the conductive posts 608, 610 are both preferably comprised of copper and are fused directly to one another without the presence of a low melting temperature metal such as a solder or tin between the conductive posts. Preferably, in order to achieve a strong bond, the joining surfaces of the conductive posts 608, 610 must be clean and substantially free of oxides, e.g., native oxides, before the conductive posts 608, 610 are joined to the terminals. Typically, a process characterized as a surface treatment of etching or micro-etching can be performed to remove surface oxides of noble metals such as copper, nickel, aluminum, and others, the surface etching process being performed without substantially affecting the thicknesses of the bumps or metal layer which underlies them. This cleaning process is best performed only shortly before the actual joining process. Under conditions in which the component parts are maintained after cleaning in a normal humidity environment of between about 30 to 70 percent relative humidity, the cleaning process can usually be performed up to a few hours, e.g., six hours, before the joining process without affecting the strength of the bond to be achieved between the bumps and the capacitor terminals.

Figure 10:
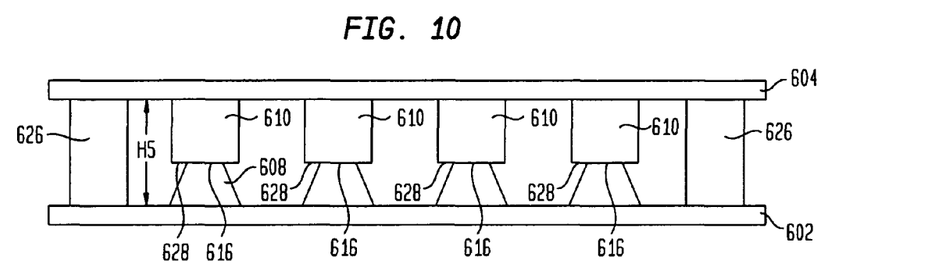
FIG. 10 is a sectional view illustrating a completed microelectronic assembly in accordance with another embodiment.
Figure 11:
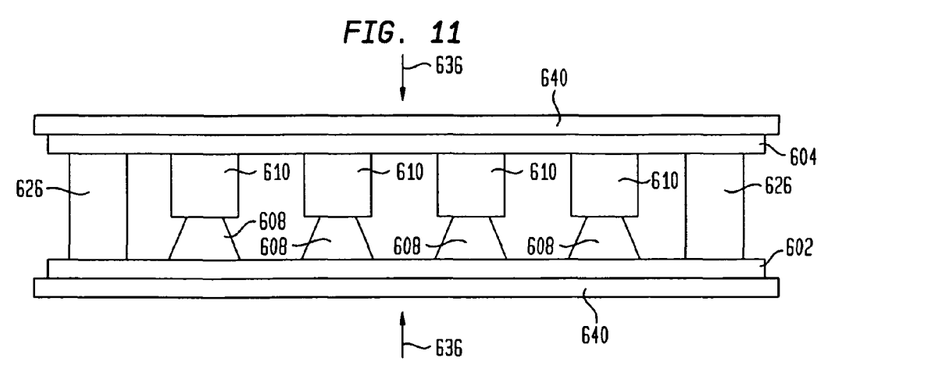
FIG. 11 is a sectional view illustrating a completed microelectronic assembly in accordance with another embodiment.

As illustrated in FIGS. 10-11, during a process performed to join the conductive posts 608, 610, a spacer structure 726 is placed on the top surface 601 of the substrate 602. The spacer structure 626 can be formed of one or more materials such as polyimide, ceramic or one or more metals such as copper. The microelectronic element 604 from which conductive posts 610 extend are placed above the spacer structure 626, such that the tips 628 of the conductive posts 610 of the microelectronic element 604 overlie the tips 616 of the conductive posts 608 of the substrate 602. Referring to FIG. 10, the spacer structure 626, microelectronic element 604 and substrate 602 are inserted between a pair of plates 640 and heat and pressure are simultaneously applied to the conductive posts in the directions indicated by arrows 636. As illustrated in FIG. 9, the pressure applied to plates 640 has an effect of reducing the height of the conductive posts to a height H6 lower than an original height H5 of the conductive posts 608, 610 as originally fabricated (FIG. 10). An exemplary range of pressure applied to during this step is between about 20 kg/cm$^2$ and about 150 kg/cm$^2$. The joining process is performed at a temperature which ranges between about 140 degrees centigrade and about 500 degrees centigrade, for example.

The joining process compresses the conductive posts 608, 610 to an extent that metal from below the former top surfaces of the conductive posts 608, 610 comes into contact and joins under heat and pressure. As a result of the joining process, the height of the conductive posts 608,610 may decrease by one micron or more. When the conductive posts 608, 610 consist essentially of copper, the joints between the conductive posts also consist essentially of copper, thus forming continuous copper structures including the bumps and terminals. Thereafter, as illustrated in FIG. 9, the plates and spacer structure are removed, leaving a subassembly 250 having conductive columns 606 formed from the conductive joinder of the conductive posts 608, 610.

Figure 12:
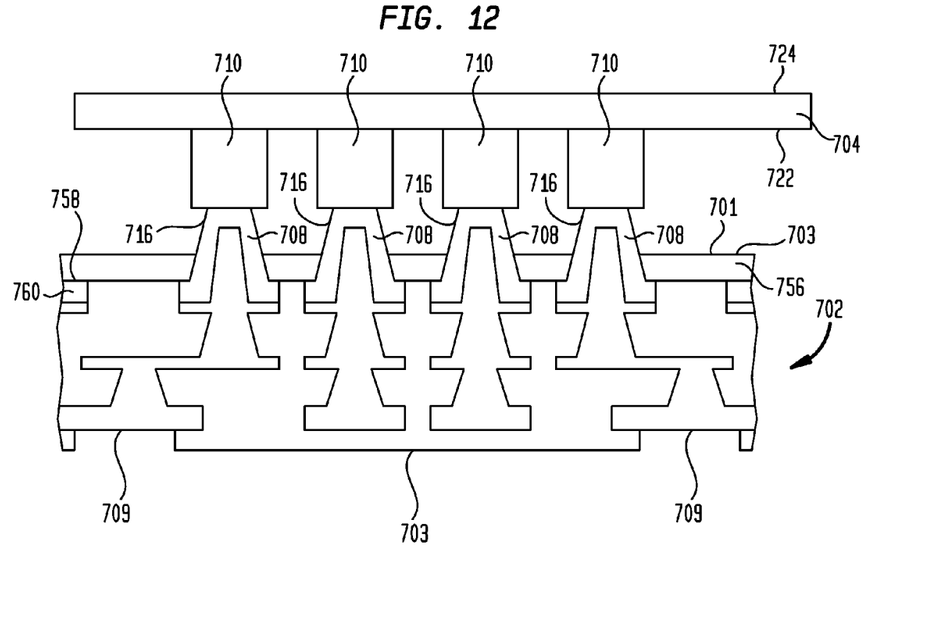
FIG. 12 is a sectional view illustrating a completed microelectronic assembly in accordance with another embodiment.

Referring to FIG. 12, another alternative embodiment in accordance with the present invention is shown. The only difference here is that instead of a single layer substrate, a multilayer substrate may be used, such as the multilayer substrates described in U.S. Appln. No. 60/964,823, filed on Aug. 15, 2007, and entitled Interconnection Element with Posts Formed by Plating; U.S. Appln. No. 60/964,916 filed Aug. 15, 2007, and entitled Multilayer Substrate With Interconnection Vias and Method of Manufacturing the Same; and U.S. patent application Ser. No. 11/824,484, filed on Jun. 29, 2007, and entitled Multilayer Wiring Element Having Pin Interface, the disclosures of which are incorporated herein. Terminals 709 may be exposed at the bottom surface 703 of the multilayer substrate 702 and joined to terminals of other devices, such as a circuit panel, wiring element, packaged microelectronic element or other conductive element. As shown, the multilayer substrate 702 is joined in a flip-chip manner with a microelectronic element 704 that has a front surface 722 and opposed rear surface 724, e.g., a semiconductor chip having active devices, passive devices or both active or passive devices thereon. As in the above embodiments (e.g., FIG. 2), a solder mask 756 may be provided on the top surface 758 of the dielectric layer 760. The tips 716 of the conductive posts 708 protrude through the top surface 703 of the solder mask 756 which is at the top surface 701 of the multilayer substrate. The tips 716 are joined as described herein to conductive posts 710 extending from the front surface 722 of the microelectronic element 704. As shown, the conductive posts 708 of the multilayer substrate 702 can be joined directly to the conductive posts 710 extending from the front surface 722 of the microelectronic element 704, such as through a diffusion bond formed between a finished metal at the tips 160 of the posts, e.g., gold, and another metal present in the conductive pads and the posts. Alternatively, the conductive posts 708, 710 posts can be joined together through a fusible metal such as a solder, tin or a eutectic composition, the fusible metal wetting the posts and the pads to form wetted or soldered joints. For example, the fusible metal can be provided in form of solder bumps (not shown), exposed at a front surface 722 of the microelectronic element 704, the bumps being provided at the ends of either or both of the tips of the conductive posts. It should be appreciated that the solder mask will prevent fusible metal from contacting the base of the conductive posts 710 and/or the contacts and traces on the dielectric layer. Similarly, as seen in FIG. 13, some posts 812 can be configured in this way.

The conductive columns may also be utilized in stacked packaging, such as those packages described in commonly owned applications U.S. Appln. Ser. No. 60/963,209, filed Aug. 3, 2007, and entitled Die Stack Package Fabricated at the Wafer Level with Pad Extensions Applied To Reconstituted Wafer Elements; U.S. Appln. No. 60/964,069, filed Aug. 9, 2007, and entitled Wafer Level Stacked Packages with Individual Chip Selection; U.S. Appln. No. 60/962,200, filed Jul. 27, 2007, and entitled Reconstituted Wafer Stack Packaging with After-Applied Pad Extensions; and U.S. Appln. No. 60/936,617, filed Jun. 20, 2007, and entitled Reconstituted Wafer Level Stacking.

Figure 13:
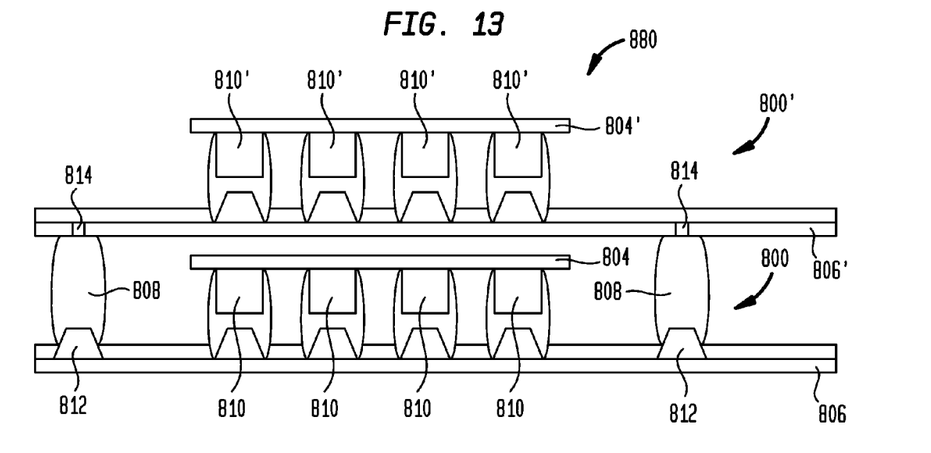
FIG. 13 is a sectional view illustrating a completed microelectronic assembly in accordance with another embodiment.

For example, with reference to FIG. 13, in an alternative embodiment, a stacked package assembly 880 includes a first subassembly 800 and a second subassembly 800'. The first and second subassemblies 800, 800' are virtually identical to the packaged microelectronic element shown in FIG. 2. As shown, conductive posts 810 extend from a microelectronic element 804 in the first subassembly 800 and conductive posts 810' extend from a microelectronic element 804' in the second subassembly 800'. In this embodiment, the first and second subassemblies 800, 800' differ to the extent that the substrates 806, 806' are longer and extend further away from the conductive posts 810, 810' to accommodate conductive columns 808 that extend between the substrates 806, 806' of the first and second subassemblies 800, 800'. The conductive columns 808 also include a conductive post 812 extending from the substrate 806 of the first subassembly 800 that connects to vias 814 extending through the top and bottom surfaces of the substrate 806' on the second subassembly 800'.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A packaged microelectronic element, comprising:
a microelectronic element having a front surface and a plurality of first solid metal posts extending away from the front surface, each first post having a width in a direction of the front surface and a height extending from the front surface, wherein the height is at least half of said width; and
a substrate having a top surface and a plurality of second solid metal posts extending from the top surface and joined to the first solid metal posts with a fusible metal, said second posts having top surfaces and edge surfaces extending abruptly away from said top surfaces of said second posts,
the substrate including terminals at a bottom surface opposite the top surface of said substrate, and conductive interconnects extending through the substrate and electrically connecting the terminals with the second solid metal posts, wherein said plurality of first solid metal posts are etched metal posts and said plurality of second solid metal posts are etched metal posts having a frustoconical shape.

2. The packaged microelectronic element of claim 1, wherein said plurality of said first solid metal posts and said plurality of said second solid metal posts consist essentially of copper.

3. The packaged microelectronic element of claim 1, wherein a ratio of a diameter of said first posts to a pitch between said first posts is no more than 3:4.

4. The packaged microelectronic element of claim 1, further comprising underbump metallizations underlying said first posts.

5. The packaged microelectronic element of claim 1, wherein a diameter of said first posts is less than one-half of a pitch between each of said first posts.

6. The packaged microelectronic element of claim 1, further comprising traces extending in a lateral direction of the substrate.

7. The packaged microelectronic element of claim 6, wherein the traces extend along at least the top surface of said substrate, the bottom surface or between the top surface and the bottom surface of the substrate.

8. The packaged microelectronic element of claim 1, wherein said terminals at the bottom surface are joined to contacts of a circuit panel.

9. The packaged microelectronic element of claim 1, wherein the substrate includes a dielectric element consisting essentially of a dielectric material.

10. A packaged microelectronic element, comprising:
a microelectronic element having a front surface and a plurality of first solid metal posts extending away from the front surface, each post having a width in a direction of the front surface and a height extending from the front surface, wherein the height is at least half of said width; and
a substrate having a top surface and a plurality of second solid metal posts extending from the top surface and joined to the first solid metal posts, the substrate including terminals at a bottom surface opposite the top surface, and conductive interconnects extending through the substrate and electrically connecting the terminals with the second solid metal posts,
wherein the first and second posts are diffusion-bonded together, and
wherein said plurality of first posts are etched posts and said plurality of second posts are etched posts having a frustoconical shape.

11. The packaged microelectronic element of claim 10, wherein a ratio of a diameter of said first posts to a pitch between said first posts is no more than 3:4.

12. The packaged microelectronic element of claim 10, wherein a distance between said front surface of said microelectronic element and said top surface of said substrate is greater than 80 microns.

13. The packaged microelectronic element of claim 10, wherein each of said first posts has a diameter that is equal to a diameter of each of said second metal posts.

14. The packaged microelectronic element of claim 10, further comprising an underfill material between said front surface of said microelectronic element and said top surface of said substrate.

15. The packaged microelectronic element of claim 10, wherein the substrate includes a dielectric element consisting essentially of a dielectric material.

16. A packaged microelectronic element, comprising:
a microelectronic element having a front surface and a plurality of first solid metal posts extending away from the front surface, each post having a width in a direction of the front surface and a height extending from the front surface, said posts consist essentially of metal other than solder, lead, or tin; and
a substrate having a top surface and a plurality of second solid metal posts extending from the top surface and joined to the first solid metal posts with a fusible metal, the substrate including terminals at a bottom surface opposite the top surface, and conductive interconnects extending through the substrate and electrically connecting the terminals with the second solid metal posts,
wherein a ratio of a diameter of said first solid metal posts to a pitch of said plurality of first solid metal posts is no more than 3:4, and
wherein said plurality of said first solid metal posts and said plurality of said second solid metal posts are etched posts having a frustoconical shape.

17. The packaged microelectronic element of claim 16, wherein each of said first posts has a diameter that is equal to a diameter of said second metal posts.

18. The packaged microelectronic element of claim 16, wherein said substrate is a multilayer substrate.

19. The packaged microelectronic element of claim 16, wherein a diameter of said first posts is less than one-half of a pitch between each of said first posts.

20. The packaged microelectronic element of claim 16, wherein the substrate includes a dielectric element consisting essentially of a dielectric material.

21. A packaged microelectronic element comprising:
a microelectronic element having a front surface and a plurality of first solid metal posts extending away from the front surface, each post having a width in a direction of the front surface and a height extending from the front surface; and
a substrate having a top surface and a plurality of second solid metal posts extending from the top surface and joined to the first solid metal posts, the substrate including terminals at a bottom surface opposite the top surface, and conductive interconnects extending through the substrate and electrically connecting the terminals with the second solid metal posts,
wherein a pitch of said first posts ranges between 50 and 200 microns and a distance between said bottom surface of said microelectronic element and said top surface of said substrate is greater than 80 microns, and
wherein said plurality of first solid metal posts are etched metal posts and said plurality of said second solid metal posts are etched metal posts having a frustoconical shape.

22. The packaged microelectronic element of claim 21, wherein a fusible metal is used to join said second posts to said first posts.

23. The packaged microelectronic element of claim 21, wherein each of said first posts has a diameter that is equal to a diameter of said second metal posts.

24. The packaged microelectronic element of claim 21, wherein a diameter of said first posts is less than one-half of a pitch between each of said first posts.

25. The packaged microelectronic element of claim 16, wherein the substrate includes a dielectric element consisting essentially of a dielectric material.

26. A packaged microelectronic element comprising:
a microelectronic element;
a substrate having a top surface, terminals at a bottom surface opposite said top surface, and conductive interconnects extending through said substrate; and
a plurality of pillars extending between said microelectronic element and said substrate, each of said plurality of pillars comprising a first metal post portion attached to said microelectronic element, a second metal post portion attached to said substrate, and a metal fusion portion, wherein said first and second metal portions are joined together by said metal fusion portion, said plurality of pillars having a length not less than 50 microns, and a height of said first metal post portions is at least half of a width of each first metal post portion, and a height of said second metal post portions is at least half of a width of each respective second metal post portion,
wherein said conductive interconnects electrically connect the terminals with said second solid metal post portions, and
wherein at least one of said plurality of first metal post portions or said plurality of second metal post portions are etched metal post portions and have a frustoconical shape.

27. The packaged microelectronic element of claim 26, wherein a distance between said front surface of said microelectronic element and said top surface of said substrate is greater than 80 microns.

28. The packaged microelectronic element of claim 26, wherein said substrate is a multilayer substrate.

29. The packaged microelectronic element of claim 26, wherein each of said first metal post portions has a diameter that is equal to a diameter of said second metal post portions.

30. The packaged microelectronic element of claim 26, wherein a diameter of said first metal post portions is less than one-half of a pitch between each of said first metal post portions.

31. The packaged microelectronic element of claim 26, wherein each of said pluralities of first and second metal post portions are etched.

32. The packaged microelectronic element of claim 26, wherein the substrate includes a dielectric element consisting essentially of a dielectric material.

* * * * *